(12) United States Patent
Wen

(10) Patent No.: US 6,212,122 B1
(45) Date of Patent: Apr. 3, 2001

(54) DUAL PORT MEMORY OPERATION METHOD WITH SYNCHRONIZED READ AND WRITE POINTERS

(75) Inventor: Sheung-Fan Wen, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/653,418

(22) Filed: Aug. 31, 2000

Related U.S. Application Data

(62) Division of application No. 09/156,516, filed on Sep. 17, 1998, now Pat. No. 6,166,963.

(51) Int. Cl.$^7$ ............................................. G11C 7/00
(52) U.S. Cl. .................. 365/230.05; 365/233; 365/220; 365/189.04
(58) Field of Search ........................ 365/189.05, 189.04, 365/220, 233, 230.05

(56) References Cited

U.S. PATENT DOCUMENTS

| | | | |
|---|---|---|---|
| 4,873,703 | * 10/1989 | Crandall et al. ................... 375/118 |
| 4,891,788 | 1/1990 | Kreifels ................................ 365/49 |
| 5,294,983 | 3/1994 | Ersoz et al. ........................ 348/521 |
| 5,426,756 | 6/1995 | Shyi et al. ........................... 395/425 |
| 5,544,104 | 8/1996 | Chauvel ........................... 365/189.01 |
| 5,555,524 | 9/1996 | Castellano ......................... 365/221 |
| 5,630,096 | 5/1997 | Zuravleff et al. ................... 395/481 |
| 5,644,604 | 7/1997 | Larson ............................... 357/354 |
| 5,748,551 | 5/1998 | Ryan et al. ...................... 365/230.03 |
| 5,784,582 | 7/1998 | Hughes ................................ 395/297 |
| 5,787,457 | 7/1998 | Miller et al. ........................ 711/105 |
| 5,811,995 | 9/1998 | Roy et al. ............................ 327/99 |
| 5,835,752 | 11/1998 | Chiang et al. ...................... 395/551 |
| 5,850,556 | * 12/1998 | Grivna ............................... 395/733 |
| 5,852,608 | 12/1998 | Csoppenszky et al. ............ 370/465 |
| 5,857,005 | 1/1999 | Buckenmaier ...................... 375/357 |
| 5,884,100 | 3/1999 | Normoyle et al. .................. 395/872 |
| 5,905,766 | 5/1999 | Nguyen ............................... 375/354 |
| 5,931,926 | 8/1999 | Yeung et al. ........................ 710/52 |
| 6,000,037 | 12/1999 | Herbert .............................. 714/400 |
| 6,006,340 | 12/1999 | O'Connell ......................... 713/600 |
| 6,134,155 | * 10/2000 | Wen ................................ 365/189.04 |

* cited by examiner

*Primary Examiner*—Viet Q. Nguyen
(74) *Attorney, Agent, or Firm*—Limbach & Limbach L.L.P.

(57) ABSTRACT

A FIFO stack is implemented using a DPRAM. One of the ports of the DPRAM is used to add elements to the FIFO stack, and the other port is used to remove elements from the FIFO stack. The ports operate in separate clock domains. A synchronization circuit coordinates the read and write operations across the clock domains.

5 Claims, 4 Drawing Sheets

DUAL PORT MEMORY OPERATION METHOD WITH SYNCHRONIZED READ AND WRITE POINTERS

This is a divisional of application Ser. No. 09/156,516, filed Sep. 17, 1998, now U.S. Pat. No. 6,166,963.

FIELD OF THE INVENTION

The present invention relates generally to the synchronization of address pointers across multiple clock domains, and in particular to a dual port First-In-First-Out (FIFO) memory which synchronizes a write and a read pointer across clock domains.

BACKGROUND OF THE INVENTION

A FIFO memory is a well-known type of memory which has numerous applications in electronic circuits and systems. A FIFO memory stores elements on a stack so that the oldest elements are removed first. In many applications, one process may add elements to the stack. This process is termed the write process. Another process may remove elements from the stack. This process is termed the read process. The write process must maintain an address pointer so that it can add elements to the stack. Similarly, the read process must maintain an address pointer so that it can remove elements from the stack.

In many applications, the FIFO memory is implemented using a dual port RAM (DPRAM). One port is used by the write process and the other port is used by the read process. The write process begins by storing an element at the lowest available memory location. The write process then adds elements at sequential memory locations by incrementing a write pointer. When the write process reaches the highest available memory location, the write pointer is incremented to return to the lowest available memory location. Accordingly, the FIFO memory operates in a circular fashion.

The read process begins by removing the element from the lowest available memory location. The read process then continues to remove elements at sequential memory locations by incrementing the read pointer. When the read pointer catches up to the write pointer the memory is empty and the read process stops removing elements from the FIFO stack. When the write pointer catches up to the read pointer, the memory is full and the write process stops adding elements.

In many applications, the write process and the read process operate in different clock domains. Accordingly, circuitry must be provided to generate the write pointer in one clock domain and to generate the read pointer in the other clock domain. In addition, the circuitry must synchronize the write and read pointers across clock domains so that the write process adds elements to empty memory locations and so that the read process removes elements from valid memory locations. This synchronization can introduce significant delays between the read and write processes. In addition, the synchronization often involves complicated custom circuitry, generally not available from CMOS standard cell libraries. Development of such custom circuitry would introduce additional cost and time.

SUMMARY OF THE INVENTION

According to one aspect of the invention, a FIFO includes a memory, a write port, a read port, and a first and a second synchronization circuit. The memory is configured to store a FIFO stack. The write port is configured to add elements to the FIFO stack based upon a write address pointer. The write port operates in a first clock domain. The read port is configured to read elements from the FIFO stack based upon a read address pointer. The read port operates in a second clock domain, different from the first clock domain. The first synchronization circuit is operationally coupled with the write port and is configured to receive the write address pointer and synchronize the write address pointer to the second clock domain. The second synchronization circuit is operationally coupled with the read port and is configured to receive the read address pointer and synchronize the read address pointer to the first clock domain.

According to another aspect of the invention, a synchronizer circuit, suitable for coordinating address pointers across clock domains, includes a first and second timing flip-flop and an inversion circuit. The first timing flip-flop is configured to generate first timing signals. The first timing flip-flop operates in a first clock domain. The inversion circuit is operationally coupled with the first timing flip-flop and is configured to generate inverted timing signals based upon the first timing signals. The second timing flip-flop is operationally coupled with the inverter and is configured to generate second timing signals based upon the inverted timing signals. The second timing flip-flop operates in a second clock domain, different from the first clock domain.

DETAILED DESCRIPTION

Figure 1:
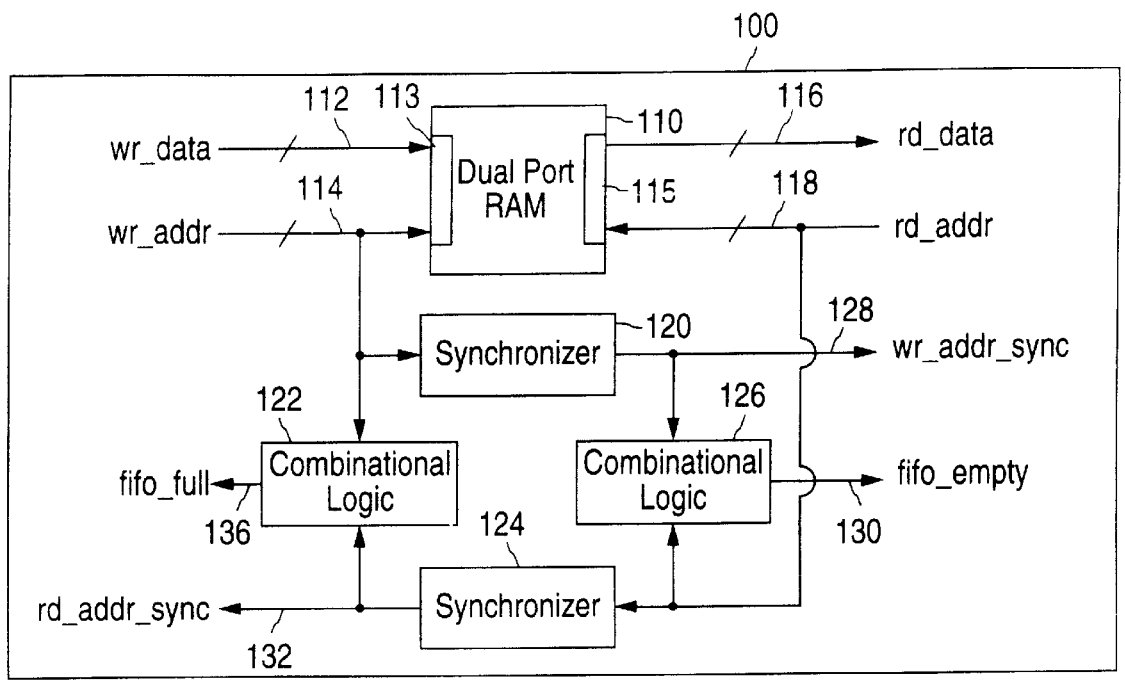
FIG. 1 is a block diagram of one preferred embodiment of a FIFO memory.

Turning to FIG. 1, one preferred FIFO memory 100 will be described. The FIFO memory 100 includes a DPRAM 110. Port 113 is used to write data to the DPRAM 110 and port 115 is used to read data from the DPRAM 110. Port 113 and port 115 each include an address port and a data port. The wr_addr lines 114 connect to port 113 and are used to select a memory location within the DPRAM 110. The wr_data lines 112 also connect to port 113. These lines are used to provide data signals to the selected address location during a write operation. Together, the wr_addr lines 114 and the wr_data lines 112 are used to add an element to a FIFO stack in DPRAM 110.

The rd_addr lines 118 connect to port 115 and are used to select a memory location within the DPRAM 110. The rd_data lines 116 also connect to port 115. These lines are used to receive data signals from the selected address location during a read operation. Together the rd_address lines 118 and the rd_data lines 116 are used to remove an element from the FIFO stack.

In one preferred embodiment, the DPRAM 110 provides only write functionality for the write port 113 and provides only read functionality to the read port 115. However, as a number of commercially available DPRAM's provide both read and write functionality to both ports, such DPRAM's will serve as suitable alternatives for implementing the invention.

The FIFO memory 100 is configured so that elements may be added to the stack through write port 113, and so that the same elements may be removed from the stack through read port 115. Elements are added to the stack at sequential memory locations through write port 113. The first element is written to memory location "000h," the next element is written to memory location "001h" and so on. Eventually, write port 113 adds an element to the highest memory location (e.g. "FFFh" in a 4K memory). After this write, the write pointer is incremented to return to the first memory location, "000h." The read pointer operates in the same manner.

To ensure that write port 113 does not attempt to add an element to a memory location containing unread data (i.e. an element which has not yet been removed through read port 115), a FIFO full signal is generated. Similarly, to ensure that read port 115 does not attempt to read an element from a memory location containing unwritten data (i.e. a memory location which has not been written to by the write port 113), a FIFO empty signal is generated.

Write port 113 and read port 115 may operate in different clock domains. Accordingly, the read and write address pointers are synchronized across the clock domains. The read and write address pointers are used to generate FIFO full (fifo_full) and FIFO empty (fifo_empty) signals.

More specifically, wr_addr lines 114 connect to synchronizer 120 and to write logic circuit 122, and rd_addr lines 118 connect to synchronizer 124 and to read logic circuit 126. Synchronizer 120 receives the current write pointer over wr_address lines 114. After a delay sufficient to coordinate the clock domains, synchronizer 120 provides the write pointer to read logic circuit 126 over lines 128. Similarly, synchronizer 124 receives the current read pointer over rd_addr lines 118. After a delay sufficient to coordinate the clock domains, synchronizer 124 provides the read pointer to write logic circuit 122 over lines 132. The read logic circuit 126 and the write logic circuit generate the fifo_empty signal 130 and fifo_full signal 136, respectively.

One preferred way of producing the fifo_empty signal 130 and the fifo_full signal 136 is to add an extra bit to the MSB side of wr_addr and rd_addr signals, and treat it as part of wr_addr or rd_addr when doing increments. For instance, assume wr_addr and rd_addr are 12-bits wide, adding a 13th bit to the MSB side makes them 13-bits wide. During reset, wr_addr[12:0] and rd_addr[12:0] are all cleared to zeros. The wr_addr is incremented until fifo_full is asserted; rd_addr is incremented until fifo_empty is asserted. Note that wr_addr[12:12] (the thirteenth bit of the wr_addr signal) and rd_addr[12:12] (the thirteenth bit of the rd_addr signal) have values of zero during odd passes of fifo memory, and values of one during even passes. Therefore, fifo_full is obtained from the logic equation: (wr_addr [12:12] XOR rd_addr_sync [12:12]) AND (wr_addr[11:0] XNOR rd_addr_sync[11:0]); fifo_empty is obtained from the logic equation: rd_addr[12:0] XNOR wr_addr_sync[12:0]. Write logic circuit 122, and read logic circuit 126 implement these logic functions to generate the fifo_full and fifo_empty signals, respectively.

At initialization, both the read and write address pointers will be set to "000h". As elements are added, the write pointer will be incremented. Consequently, read logic circuit 126 will deassert the fifo_empty signal. In response, elements will be read from the FIFO and the read pointer will be incremented. When the read pointer catches up to the write pointer, the fifo_empty signal is asserted until additional elements are added to the FIFO stack.

As mentioned above, when the write pointer reaches the highest memory location, it is incremented to return to the first memory location. As additional elements are added, the write address pointer may eventually catch-up to the read address pointer. If additional elements were added, these elements would overwrite elements which had not yet been read from the stack. To avoid this problem, the fifo_full signal is asserted. No additional writes may occur until additional elements are removed from the FIFO stack.

As mentioned above, the FIFO stack is implemented in DPRAM 110. This configuration is suitable for use with a DPRAM having any commonly available size and width.

Figure 2:
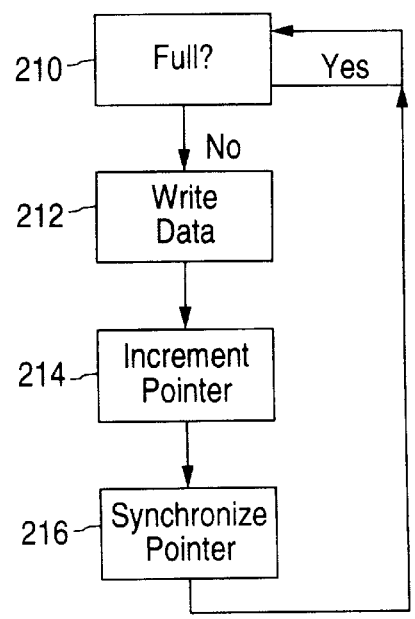
FIG. 2 is a flow chart showing one preferred write process operating on the FIFO memory of FIG. 1.

Turning to FIG. 2, the process for adding elements to the FIFO stack will be described in further detail. At step 210, the FIFO determines whether the fifo_full signal is asserted. If so, the FIFO remains at step 210. Otherwise, the FIFO proceeds to step 212. Here, the FIFO increments the write pointer so that an element may be added to the next memory location. At step 214, the FIFO adds an element to the stack at the address location selected by the write pointer. At step 216, the new write pointer is passed across the clock domain. This allows the read process to remove the next element. The FIFO then returns to step 210.

Figure 3:
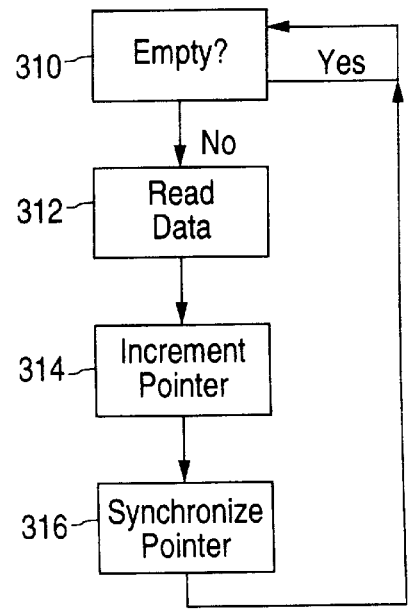
FIG. 3 is a flow chart showing one preferred read process operating on the FIFO memory of FIG. 1.

Turning to FIG. 3, the process for removing elements from the FIFO will be described in further detail. At block 310, the FIFO determines whether the fifo_empty signal is asserted. If so, the FIFO remains at block 310. Otherwise, the FIFO proceeds to block 312. Here, the FIFO reads data from the memory location selected by the read pointer. At block 314, the FIFO increments the read pointer. At block 316, the new read pointer is passed across the clock domain. This allows the write process to add an element to the emptied memory location. The FIFO then returns to block 310.

Figure 4:
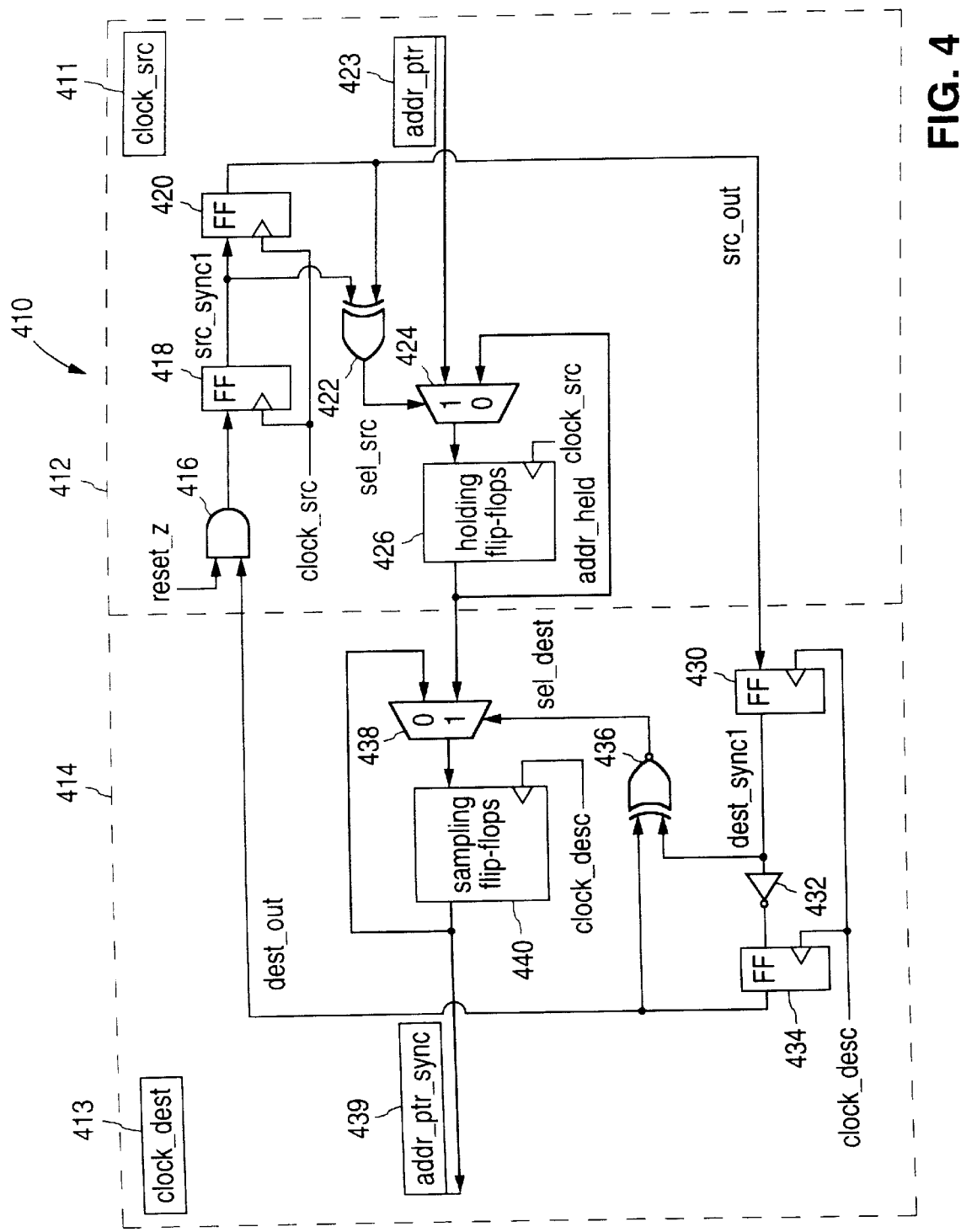
FIG. 4 is a circuit diagram of one preferred embodiment of an address synchronization circuit.

Turning to FIG. 4, one preferred embodiment of an address synchronization circuit 410 (hereinafter address synchronizer 410) will be described. The address sychronizer 410 may be used to implement the synchronizer 120 and the sychronizer 124 of FIG. 1. The address synchronizer 410 is divided into two clock domains. Specifically, block 412 operates based upon clock 411 (clock_src) while block 414 operates based upon clock 413 (clock_dest). Clock 411 and clock 413 are asynchronous to each other and may operate at different frequencies. Accordingly, block 412 defines a clock domain based upon clock 411 and block 414 defines a clock domain based upon clock 413.

The address synchronizer 410 operates to coordinate the passage of an address pointer 423 (addr_ptr) from the clock domain of block 412 to a synchronized address pointer 439 (addr_ptr sync) in the clock domain of block 414.

The circuit begins operation upon receipt of a reset_z signal by AND gate 416. The reset_z signal is used to initiate normal circuit operation. During operation of the synchronizer circuit 410 the reset_z signal must remain in a high state. The AND gate 416 also receives a dest_out signal from timing flip-flop 434. When both the reset_z signal and the dest_out signal are in a high state, the AND gate 416 provides a high-level signal to timing flip-flop 418. Timing flip-flop 418 is triggered by clock 411. Upon the start of a new clock cycle, timing flip-flop 418 passes the high-level signal from AND gate 416 as the src_sync1 signal.

This signal is in turn provided to timing flip-flop 420 and to XOR gate 422. Timing flip-flop 420 functions in the same manner as timing flip-flop 418. Upon the start of a new clock cycle, timing flip-flop 420 passes the value of the src_sync1 signal as the src_out signal. Accordingly, when the src_sync1 signal experiences a transition, the value of the src_out signal will not match for one clock period. As both of these signals are provided to XOR gate 422, it generates a high level signal for the same clock period.

The output of XOR gate 422 is provided to the control input of multiplexor 424. Multiplexor 424 also receives the pointer value held by holding flip-flops 426 as well as addr_ptr 423, which indicates the current pointer value. When multiplexor 424 receives a high level signal from XOR gate 422 it provides the value of addr_ptr 423 to holding flip-flops 426. Otherwise, it provides the pointer value from the output of holding flip-flops 426 to the input of holding flip-flops 426. The pointer value from the output of holding flip-flops 426 is provided across the clock boundary to multiplexor 438. Again, timing flip-flop 430 receives the src_out signal from timing flip-flop 420. Upon the start of a new clock cycle within the clock domain of block 414, timing flip-flop 430 passes the value of the src_out signal as the dest_sync1 signal. The dest_sync1 signal is provided to inverter 432. The inverted dest_sync1 signal is provided to timing flip-flop 434 and to XOR gate 436. Timing flip-flop 434 functions in the same manner as timing flip-flop 430. Upon the start of a new clock cycle, timing flip-flop 434 passes the value of the inverted dest_sync1 signal as the dest_out signal. Accordingly, when the inverted dest_sync2 signal experiences a transition, the value of the dest_out signal will not match for one clock period. As both of these signals are provided to XOR 436, it generates a high level signal for the same clock period.

The output of XOR gate 436 is provided to the control input of multiplexor 438. Multiplexor 438 also receives the pointer value currently held by sampling flip-flops 440 and the output of holding flip-flops 426. When multiplexor 438 receives a high level signal from XOR gate 436, it provides the pointer value from holding flip-flops 426. Otherwise, it provides the pointer value from the output of sampling flip-flops 440 to the input of sampling flip-flops 440. The pointer value from the output of sampling flip-flops 440 is the addr_ptr_sync signal. Accordingly, this signal follows the addr_ptr signal. However, the addr_ptr_sync signal is valid in the clock domain of block 414.

The synchronization circuit 410 can be implemented using circuit elements from a commercially available CMOS standard cell library. All of the gates, flip-flops, and multiplexors are commonly available.

Under normal operation, the address synchronizer 410 will effectively translate the addr_ptr 423 across clock domains to the addr_ptr_sync 439. However, it is possible for timing flip-flop 418 to enter a meta-stable state. To avoid corruption of data due to a meta-stable state, flip-flop 420 is arranged back-to-back with flip-flop 418 so that there will be enough time for the flip-flop 418 to recover from a meta-stable state before data enters flip-flop 420. This arrangement may also be termed double-synchronization and will provide stable operation if the signal delay from timing flip-flop 418 to holding flip-flop 426 is less than the clock period of clk_src and the signal delay from timing flip-flop 430 to sampling flip-flop 440 is less than the clock period of clk_dest. The signal delay from timing flip-flop 418 to holding flip-flop 426 includes: t(flip-flop 418 clock to Q)+t(flip-flop 418 recovery from meta-stable state)+t(XOR gate)+t(multiplexor 424)+t(flip-flop 426 setup)+t(wire delays). The signal delay from timing flip-flop 430 to sampling flip-flop 440 includes: t(flip-flop 430 clock to Q)+t(flip-flop 430 recovery from meta-stable state)+t(invertor 432)+t(XNOR gate 436)+t(multiplexor 438)+t(flip-flop 440 setup)+t(wire delays). If these conditions cannot be met, a meta-stable state may result, which may cause undefined transitions. This potential meta-stable state can be avoided by adding additional timing flip-flops to the address synchronizer 410.

Figure 5:
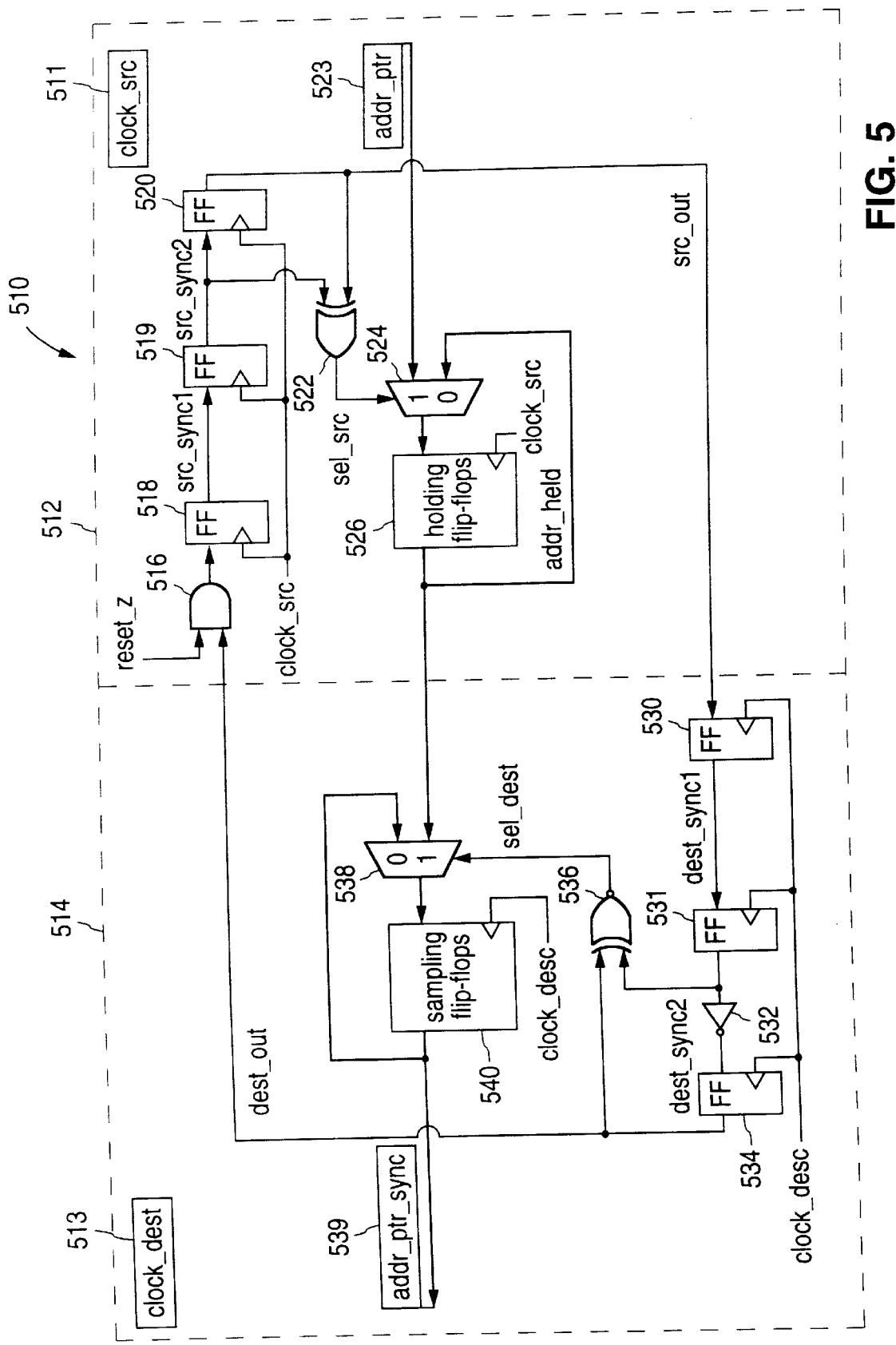
FIG. 5 is a circuit diagram of another preferred embodiment of an address synchronization circuit.

Turning to FIG. 5, another preferred embodiment of an address synchronization circuit 510 (hereinafter address synchronizer 510) will be described. The address sychronizer 510 may be used to implement the synchronizer 120 and the sychronizer 124 of FIG. 1. The address sychronizer 510 operates in much the same way as the address sychronizer 410 of FIG. 4. However, address sychronizer 510 uses two additional timing flip-flops. These timing flip-flops reduce the probability of the above-described meta-stable state and introduce only minimal additional synchronization delay.

The address synchronizer 510 is divided into two clock domains. Specifically, block 512 operates based upon clock 511 (clock_src) while block 514 operates based upon clock 513 (clock_dest). Clock 511 and clock 513 are asychronous to each other and may operate at different frequencies. Accordingly, block 512 defines a clock domain based upon clock 511 and block 514 defines a clock domain based upon clock 513.

The address synchronizer 510 operates to coordinate the passage of an address pointer 523 (addr_ptr) from the clock domain of block 512 to a synchronized address pointer 539 (addr_ptr_sync) in the clock domain of block 514.

The circuit begins operation upon receipt of a reset_z signal by AND gate 516. The reset_z signal is used to initiate normal circuit operation. During operation of the synchronizer circuit 510 the reset_z signal must remain in a high state. The AND gate 516 also receives a dest_out signal from timing flip-flop 534. When both the reset_z signal and the dest_out signal are in a high state, the AND gate 516 provides a high-level signal to timing flip-flop 518. Timing flip-flop 418 is triggered by clock 511. Upon the start of a new clock cycle, timing flip-flop 518 passes the high-level signal from AND gate 516 as the src_sync1 signal. This signal is in turn provided to timing flip-flop 519. Timing flip-flop 519 functions in the same manner as timing flip-flop 518. Upon the start of a new clock cycle, timing flip-flop 519 passes the value of the src_sync1 signal as the src_sync2 signal. This signal is in turn provided to timing flip-flop 520 and to XOR gate 522. Timing flip-flop 520 functions in the same manner as timing flip-flop 518. Upon the start of a new clock cycle, timing flip-flop 520 passes the value of the src_sync2 signal as the src_out signal. Accordingly, when the src_sync2 signal experiences a transition, the value of the src_out signal will not match for one clock period. As both of these signals are provided to XOR gate 522, it generates a high level signal for the same clock period.

The output of XOR gate 522 is provided to the control input of multiplexor 524. Multiplexor 524 also receives the pointer value held by holding flip-flops 526 (addr_held) as well as the addr_ptr signal 523, which indicates the current pointer value. When multiplexor 524 receives a high level signal from XOR gate 522 it provides the value of the addr ptr signal to holding flip-flops 526. Otherwise, it provides the pointer value from the output of holding flip-flops 526 to the input of holding flip-flops 526. The pointer value from the output of holding flip-flops 526 is provided across the clock boundary to multiplexor 538.

Again, timing flip-flop 530 receives the src_out signal from timing flip-flop 520. Upon the start of a new clock cycle within the clock domain of block 514, timing flip-flop 530 passes the value of the src_out signal as the dest_sync1 signal. This signal is in turn provided to timing flip-flop 531, which operates in the same manner as timing flip-flop 530. Upon the start of a new clock cycle, timing flip-flop 531 passes the value of the dest_sync1 signal as the dest_sync2 signal. The dest_sync2 signal is provided to inverter 532 and to XNOR 536. The inverted dest_sync2 signal is provided to timing flip-flop 534. Timing flip-flop 534 functions in the same manner as timing flip-flop 530. Upon the start of a new clock cycle, timing flip-flop 534 passes the value of the inverted dest_sync2 signal as the dest_out signal. Accordingly, when the inverted dest sync1 signal experiences a transition, the value of the dest_out signal will be at an equivalent level to dest_synch2 for one clock period. As both of these signals are provided to XNOR 536, it generates a high level signal for the same clock period.

The output of XNOR gate 536 is provided to the control input of multiplexor 538. Multiplexor 538 also receives the pointer value currently held by sampling flip-flops 540 and the output of holding flip-flops 426. When multiplexor 438 receives a high level signal from XOR gate 536, it provides the pointer value from holding flip-flops 526. Otherwise, it provides the pointer value from the output of sampling flip-flops 540 to the input of sampling flip-flops 540. The pointer value from the output of sampling flip-flops 540 is the addr_ptr_sync signal 539. Accordingly, this signal follows the addr_ptr signal 523. However, the addr_ptr_sync signal 539 is valid in the clock domain of block 514.

The synchronization circuit 510 can be implemented using circuit elements from a commercially available CMOS standard cell library. All of the gates, flip-flops, and multiplexors are commonly available.

Figure 6:
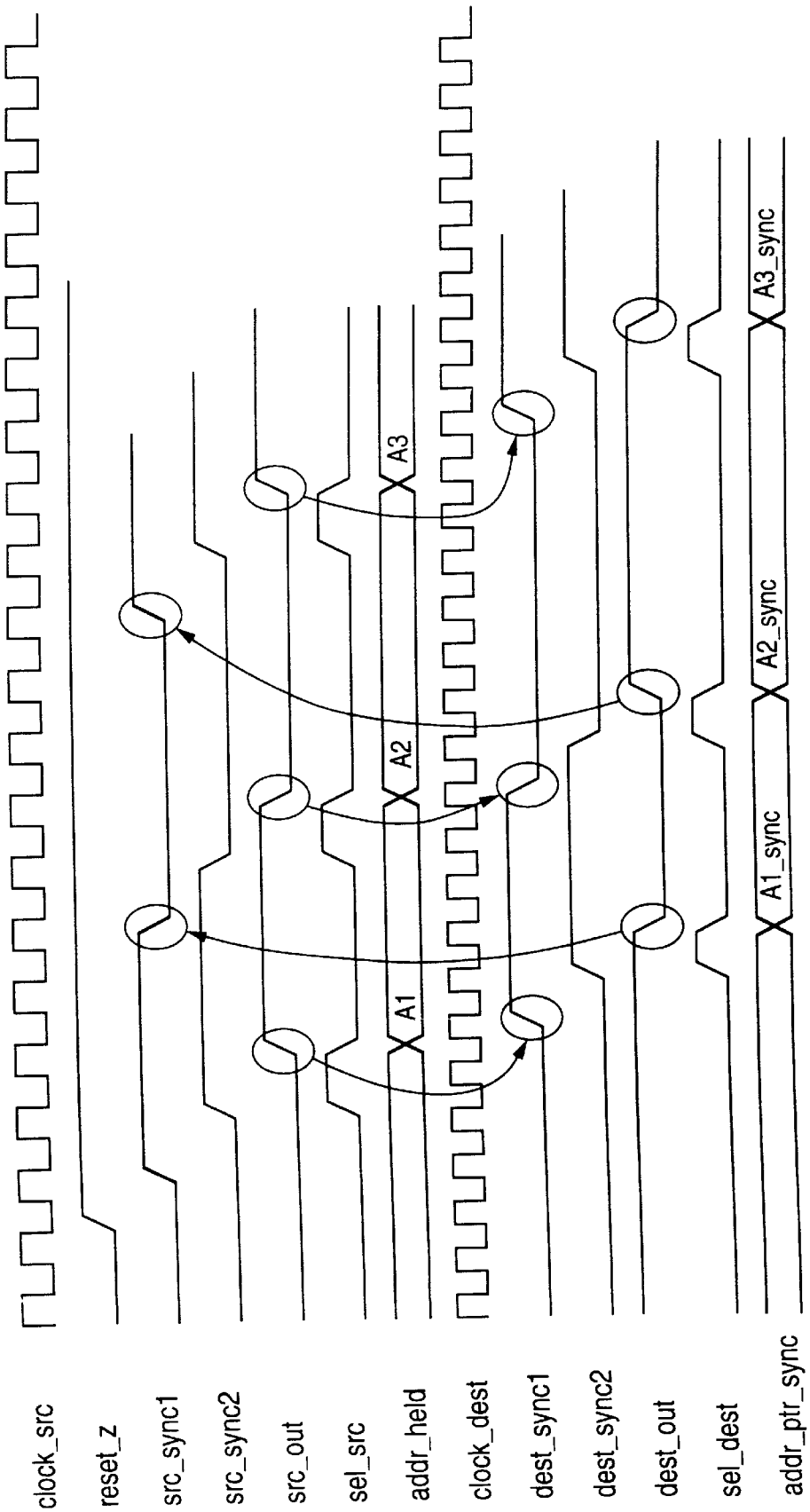
FIG. 6 is a timing diagram showing signals.from the circuit of FIG. 5.

Turning to FIG. 6, a timing diagram of the signals in FIG. 5 will be described. The timing diagram includes a clock_src signal and a clock_dest signal. These are clock signals which operate asynchronously and at different frequencies. The src_sync1, src_sync2, src_out, sel_src and addr_held signals operate based upon the clock_src signal. The dest_sync1, dest_sync2, dest_out, sel_dest and addr_prt_sync signals operate based upon the clock_dest signal.

The reset_z signal begins in a low state then transitions to a high state. This transition is used to initiate normal operation of the sycnronization circuit. After the reset_z signal has been in the high state for one clock period of the clock_src signal, the src_sync1 signal transitions to a high state. Then, after one clock period of the clock_src signal, the src_sync2 signal transitions to a high state. Since the src_sync2 signal does not match the src_out signal, the sel_src signal enters a high state. After one clock period of the clock_src signal, the sel_src signal causes the addr_held to read the next address pointer signal. The first address pointer signal is identified as A1. Subsequent address pointer signals are identified as A2 and A3.

After the src_sync2 signal has been in a high state for one clock period, the src_out signal transitions to a high state. Since the src_out signal now matches the src_sync2 signal, the sel_src signal is deasserted. Accordingly, address pointer A1 is held by the addr_held signal.

The transition of the src_out signal is passed to the dest_sync1 signal. More specifically, upon the next rising edge of the clock dest signal, the dest sync1 signal experiences the same transition. After one period of the clock_dest signal, the dest_sync2 signal follows the dest_sync1 signal and transtions to a high state.

Since the dest_sync2 signal matches the dest_out signal, the sel_dest signal enters a high state. After one clock period of the clock_dest signal, the sel_dest signal causes the addr_prt_sync to read the next address pointer signal. The first address pointer signal is identified as A1_sync. This signal matches the addr_held signal A1, but is valid in the clock domain of the clock_dest signal. Subsequent address pointer signals in the clock domain of the clock_dest signal are identified as A2_sync and A3_sync. These signals follow A2 and A3, respectively.

One clock period after the dest_sync2 signal experiences a transition, the dest_out signal experiences the opposite transition. Since the dest_out signal no longer matches the dest_sync2 signal, the sel_dest signal is deasserted and the A1_sync address pointer is held by the addr_ptr_sync signal.

As shown by the timing diagram, subsequent transitions in the timing signals cause the address pointer signals A2 and A3 to be passed across the clock domains to the synchronized address signals A2 sync and A3_sync.

Transitions in the src_out signal initiate a read of a new address pointer. These transitions are passed from the clock_src domain to the clock_dest domain. Based upon the src_out signal, the dest_out signal experiences a delayed transition. This delayed transition is used to initiate the tranfser of the new address pointer across the clock domains. This delayed transition is also passed back across the clock domains to initiate another transition in the src_sync1 signal. This in turn initiates a read of a new address pointer.

Stated differently, the transitions in the src_out signal and the dest_out signal act as a token. This token is passed from the source clock domain 512 to the destination clock domain 514 and back again, continuously. The token is initiated by the assertion of the reset_z signal and begins as a transition in the dest_out signal. The token is then passed as transitions in the src_sync1, src_sync2, src_out, dest_sync1 and dest_sync2 signals. The token is returned back to dest_out by a transition in the dest_sync2 signal.

A src_out token (i.e. a transition in the src_out signal) indicates that a new address pointer has been written to the holding flip-flops. When this token is passed across clock domains, it initates the synchronization of the new address pointer.

Similarly, the dest_out token indicates that the new address pointer has been sychronized across clock domains, and held in the sampling flip-flops. When this token is returned across clock domains, it initiates the read of a new address pointer. In this way, address pointers are passed across clock domains.

The synchronization circuit 510 (shown in FIG. 5) can be further optimized by introducing additional logic gates for controlling the start and termination of this token transfer. For example, an additional input to AND gate 516 can be used for this purpose.

Although the embodiments described herein are with reference to a FIFO memory, the present invention is applicable to other circuits which require the synchronization of data across clock domains. Moreover, although the embodiments described herein are with reference to particular circuit and block diagrams, other configurations are suitable for implementing the described functionality. Those having ordinary skill in the art will certainly understand from the embodiments disclosed herein that many modifications are possible without departing from the teachings hereof. All such modifications are intended to be encompassed within the following claims.

What is claimed is:

1. A method for operating a dual port memory suitable for transferring an address pointer across clock domains comprising the steps of:

generating a first clock signal having a first frequency wherein circuit elements operating based upon the first clock signal operate in a first clock domain;

generating a second clock signal having a second frequency wherein circuit elements operating based upon the second clock signal operate in a second clock domain, and wherein the first and second clock signals are asynchronous;

generating a first synchronization signal, wherein the first synchronization signal includes a first token and a second token;

receiving a first address pointer based upon the first token of the first synchronization signal;

generating a second synchronization signal having a first token, wherein the first token of the first synchronization signal is passed from the first clock domain to the second clock domain and becomes the first token of the second synchronization signal; and transferring a first address pointer from the first clock domain to the second clock domain based upon the first token of the second synchronization signal.

2. The method for operating a dual port memory of claim 1, further comprising the step of:

passing the first token of the second synchronization signal from the second clock domain to the first domain after the step of transferring the first address pointer, wherein the first token of the second synchronization signal becomes the second token of the first synchronization signal.

3. The method of claim 2, wherein:

the first token of the first signal comprises a transition from a low to a high state;

the first token of the second signal comprises a transition from a low to a high state; and the second token of the first signal comprises a transition from a high state to a low state.

4. The method of claim 2, further comprising the step of:

writing data to a first memory location before passing the first token of the first signal to the first token of the second signal, wherein the first address pointer identifies the first memory location.

5. The method of claim 4, wherein the first frequency differs from the second frequency.

* * * * *